(12) United States Patent
Kim

(10) Patent No.: US 10,345,403 B2
(45) Date of Patent: Jul. 9, 2019

(54) RADIO FREQUENCY SURFACE COIL AND MAGNETIC RESONANCE DEVICE EMPLOYING THE SAME

(71) Applicant: Samsung Electronics Co., Ltd., Suwon-si (KR)

(72) Inventor: Kyoungnam Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 190 days.

(21) Appl. No.: 15/319,494

(22) PCT Filed: Aug. 19, 2014

(86) PCT No.: PCT/KR2014/007682
§ 371 (c)(1),
(2) Date: Dec. 16, 2016

(87) PCT Pub. No.: WO2015/194700
PCT Pub. Date: Dec. 23, 2015

(65) Prior Publication Data
US 2017/0219666 A1 Aug. 3, 2017

(30) Foreign Application Priority Data
Jun. 18, 2014 (KR) .................. 10-2014-0074505

(51) Int. Cl.
*G01R 33/341* (2006.01)
*G01R 33/34* (2006.01)
(Continued)

(52) U.S. Cl.
CPC ..... *G01R 33/341* (2013.01); *G01R 33/34046* (2013.01); *G01R 33/3415* (2013.01); *G01R 33/3628* (2013.01)

(58) Field of Classification Search
CPC .......... G01R 33/341; G01R 33/34046; G01R 33/3415; G01R 33/3628
See application file for complete search history.

(56) References Cited

U.S. PATENT DOCUMENTS 6,591,128 B1 * 7/2003 Wu .................. G01R 33/34084
324/318
6,906,518 B2 6/2005 Leussler
(Continued)

FOREIGN PATENT DOCUMENTS

JP 5-226153 A 9/1993
JP 2003-180659 A 7/2003
(Continued)

OTHER PUBLICATIONS

Machine Translation of KR 10-2002-0088512 A obtained on Aug. 21, 2018 (Year: 2002).*
(Continued)

Primary Examiner — Gregory H Curran
(74) Attorney, Agent, or Firm — NSIP Law

(57) ABSTRACT

A radio frequency (RF) surface coil and a magnetic resonance device employing the same are disclosed. The disclosed RF surface coil for the magnetic resonance device comprises: a plurality of conductor elements connected in series so as to form a loop-shaped surface coil; and a variable inductance unit provided in at least one of the plurality of conductor elements so as to adjust inductance, wherein the variable inductance unit comprises a conductor bar and a coupler for attachably/detachably coupling the conductor bar to/from at least one of the plurality of conductor elements.

20 Claims, 14 Drawing Sheets

(51) Int. Cl.
G01R 33/3415 (2006.01)
G01R 33/36 (2006.01)

(56) References Cited

U.S. PATENT DOCUMENTS

| | | |
|---|---|---|
| 7,332,910 B2 | 2/2008 | Laubacher et al. |
| 8,188,744 B2 | 5/2012 | Lee et al. |
| 8,198,894 B2 | 6/2012 | Kaneko et al. |
| 2010/0013483 A1 | 1/2010 | Odintsov |
| 2013/0093425 A1 | 4/2013 | Chu et al. |
| 2014/0125339 A1 | 5/2014 | Lee et al. |

FOREIGN PATENT DOCUMENTS

| | | |
|---|---|---|
| JP | 5247214 B2 | 7/2013 |
| KR | 10-2002-0088512 A | 11/2002 |
| KR | 10-2010-0019206 A | 2/2010 |
| KR | 10-2014-0059575 A | 5/2014 |

OTHER PUBLICATIONS

International Search Report issued in counterpart International Application No. PCT/KR2014/007682 dated Mar. 5, 2015. (2 pages in English).

\* cited by examiner

RADIO FREQUENCY SURFACE COIL AND MAGNETIC RESONANCE DEVICE EMPLOYING THE SAME

CROSS-REFERENCE TO RELATED APPLICATIONS

This application is a U.S. National Stage application of International Application No. PCT/KR2014/007682 filed on Aug. 19, 2014, which claims the benefit under 35 USC 119(a) of Korean Patent Application No. 10-2014-0074505 filed Jun. 18, 2014, in the Korean Intellectual Property Office, the entire disclosure of which is incorporated herein by reference for all purposes.

TECHNICAL FIELD

The present disclosure relates to a magnetic resonance device, and in particular, to a radio frequency (RF) surface coil, which is positioned near a subject to receive a magnetic resonance signal, and a magnetic resonance device employing the same.

BACKGROUND ART

A magnetic resonance imaging (MRI) device, a magnetic resonance spectroscopy (MRS) device, and so forth are known as a magnetic resonance device exploiting the nuclear magnetic resonance (NMR) phenomenon.

The MRI device is used to obtain a sectional image of a subject (e.g., a human body) by using the NMR phenomenon. Owing to the NMR phenomenon, some atomic nuclei (e.g., hydrogen ($^{1}H$), phosphorus ($^{31}P$), sodium ($^{23}Na$), carbon isotope ($^{13}C$), and so forth) existing in a human body have their own rotating magnetic field constants. Accordingly, if an electromagnetic wave is applied to a magnetization vector of such an atomic nucleus, the magnetization vector may lie on a vertical plane owing to the resonance of the magnetization vector, and a magnetic resonance signal to be produced from the magnetization vector may be used to obtain an internal image of the human body. Here, an RF coil may be used to transmit an electromagnetic wave for inducing the resonance of the magnetization vector in the human body and to receive the magnetic resonance signal produced from the magnetization vector lying on the vertical plane owing to the resonance. Given that the RF coil is used to transmit an electromagnetic wave for the resonance of the magnetization vector and to receive the magnetic resonance signal, the RF coil may also be called an RF antenna. A single RF coil or antenna may be used not only to induce the resonance of the magnetization vector (in a transmission mode) but also to receive the magnetic resonance signal (in a reception mode), and in certain cases, two different RF coils may be used to separately perform the transmission mode and the reception mode. A single coil configured to perform in both the transmission and reception modes is called a transceiving coil, a coil for the transmission mode is called a transmission coil, and a coil for the reception mode is called a reception coil. Meanwhile, the RF coil may include a body type RF coil, which is provided in an exterior part of an MRI device, and a surface type RF coil or a volume type RF coil, which is attached to, or positioned adjacent to, a human body. Since the body type RF coil is provided in the exterior part of the MRI device, it may be formed on a cylinder-shaped frame or an elliptical cylinder-shaped frame that has a size allowing a human body to be entered therein and it may be used as the transceiving or transmission coil. By contrast, the surface or volume type RF coil may be attached to a human body and may be attachably/detachably provided to a table on which a human body lies. Generally, the surface or volume type RF coil may be produced to have a shape suitable for a part of a human body, and thus, it may include a head coil, a neck coil, a waist coil, and so forth. Furthermore, the surface or volume type RF coil may be used as the transceiving or reception coil.

The MRS device may be used to analyze physical, chemical, or biological properties of a material using the magnetic resonance phenomenon. In the MRS device, a transmission RF coil may be used to provide an RF signal into a subject, which is positioned within a magnetic field, thereby inducing a magnetic resonance phenomenon, and a reception RF coil may be positioned near the subject and may be used to detect a magnetic resonance signal. Since a difference in kinds of atoms in the subject leads to a difference in magnetic resonance frequency, by examining a spectrum of the magnetic resonance signal, it is possible to determine the kinds of atoms contained in the subject.

An RF surface coil, which is provided in the form of a loop coil or a loop coil array, is often used as the surface or volume type RF coil. Inductance of such an RF surface coil is determined by a shape of a coil. Accordingly, a conventional RF surface coil is controlled to have a capacitance value suitable for a magnetic resonance device in use and to be in accord with a center frequency of the magnetic resonance device.

TECHNICAL PROBLEM

The conventionally proposed RF surface coil has an invariant inductance, and thus, in order to use a single RF surface coil for a magnetic resonance device with different center frequencies, it is necessary to change a capacitance of a capacitor inserted in the RF surface coil. The present invention is designed to provide an RF surface coil, which does not suffer from such a problem, and a magnetic resonance device employing the same.

TECHNICAL SOLUTION

According to an aspect of the inventive concept, a radio frequency (RF) surface coil for a magnetic resonance device may include a plurality of conductor elements connected in series to form a loop-shaped surface coil and a variable inductance unit provided in at least one of the plurality of conductor elements to adjust inductance. The variable inductance unit may include a conductor bar and a coupler for attachably/detachably coupling the conductor bar to at least one of the plurality of conductor elements.

The coupler may include a plurality of coupling positions, to which the conductor bar is attachably/detachably coupled.

The conductor bar may be positioned parallel to, or diagonally coupled to, the plurality of coupling positions.

The conductor bar may have a linear shape, a bent shape, or a curved shape.

The conductor bar may be connected in series to at least one of the plurality of conductor elements. For example, the at least one of the plurality of conductor elements may include conductive plates spaced apart from each other, the coupler may include first and second couplers provided at facing end portions of the conductive plates, and the conductor bar may be connected in series to the conductive plates by being attachably/detachably coupled to the first and second couplers.

The conductor bar may be connected in parallel to at least one of the plurality of conductor elements. For example, the at least one of the plurality of conductor elements may include a conductive plate, the coupler may include first and second couplers provided at a side portion of the conductive plate, and the conductor bar may be connected in parallel to the conductive plate by being attachably/detachably coupled to the first and second couplers.

The coupler may be a recess region, which allows the conductor bar to be attachably/detachably coupled thereto, or a fastening hole, which allows the conductor bar to be fastened thereto by a bolt.

The RF surface coil may further include at least one tuning capacitor positioned between at least some of the plurality of conductor elements to adjust capacitance. The tuning capacitor may be a variable capacitor with a variable capacitance.

The loop-shaped surface coil formed by the plurality of conductor elements may be one of rectangular, circular, and hexagonal loop-shaped surface coils.

According to another aspect of the inventive concept, the RF surface coil may include a loop coil array in which a plurality of loop-shaped surface coils are arranged and at least some of the plurality of loop-shaped surface coils may include the variable inductance unit.

The RF surface coil may further include a decoupling device positioned between the plurality of loop-shaped surface coils to prevent the plurality of loop-shaped surface coils from magnetically interacting with each other.

The plurality of loop-shaped surface coils may be independently operated.

According to another aspect of the inventive concept, a magnetic resonance device may include a main magnet and a radio frequency (RF) surface coil. The RF surface coil may include a plurality of conductor elements connected in series to form a loop-shaped surface coil and a variable inductance unit provided in at least one of the plurality of conductor elements to adjust inductance of the RF surface coil. The variable inductance unit may include a conductor bar and a coupler for attachably/detachably coupling the conductor bar to at least one of the plurality of conductor elements.

The RF surface coil may be a transmission coil for transmitting an RF signal, a reception coil for receiving a magnetic resonance signal induced in a subject, or a transceiving coil for transmitting an RF signal and receiving a magnetic resonance signal induced in a subject.

The magnetic resonance device may be a magnetic resonance imaging device, and the RF surface coil may be a surface type RF coil or a local volume type RF coil provided near the subject.

The magnetic resonance device may further include a body type RF coil, a gradient magnetic field coil, and a cylindrical housing, in which the main magnet, the body type RF coil, and the gradient magnetic field coil are mounted.

ADVANTAGEOUS EFFECTS OF THE INVENTION

According to an RF surface coil disclosed in any one of the above embodiments and a magnetic resonance device employing the same, the RF surface coil has a structure capable of easily adjusting an inductance thereof.

Since it is possible to easily adjust the inductance of the RF surface coil, the RF surface coil can be used for various magnetic resonance devices with different center frequencies.

Since it is possible to adjust the inductance of the RF surface coil, it is possible to minimize a frequency shift effect which may occur when a subject is loaded.

MODE OF THE INVENTION

Figure 1:
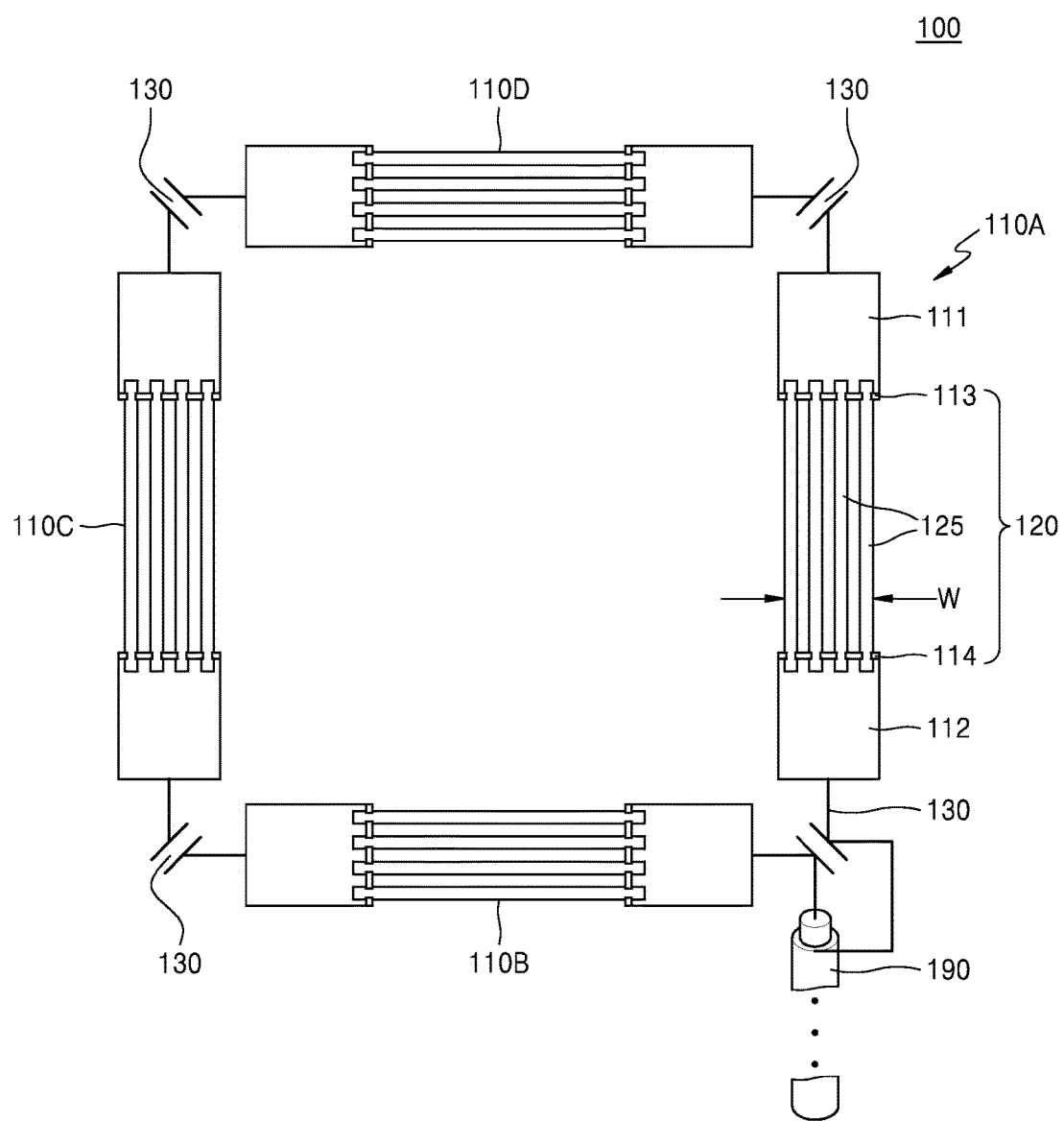
FIG. 1 schematically illustrates a radio frequency (RF) surface coil according to an embodiment of the present invention.

Some embodiments of the present invention will now be described more fully hereinafter with reference to the accompanying drawings. In the drawings, like reference numerals denote like elements, and sizes or thicknesses of respective elements are exaggerated for clarity.

Figure 2:
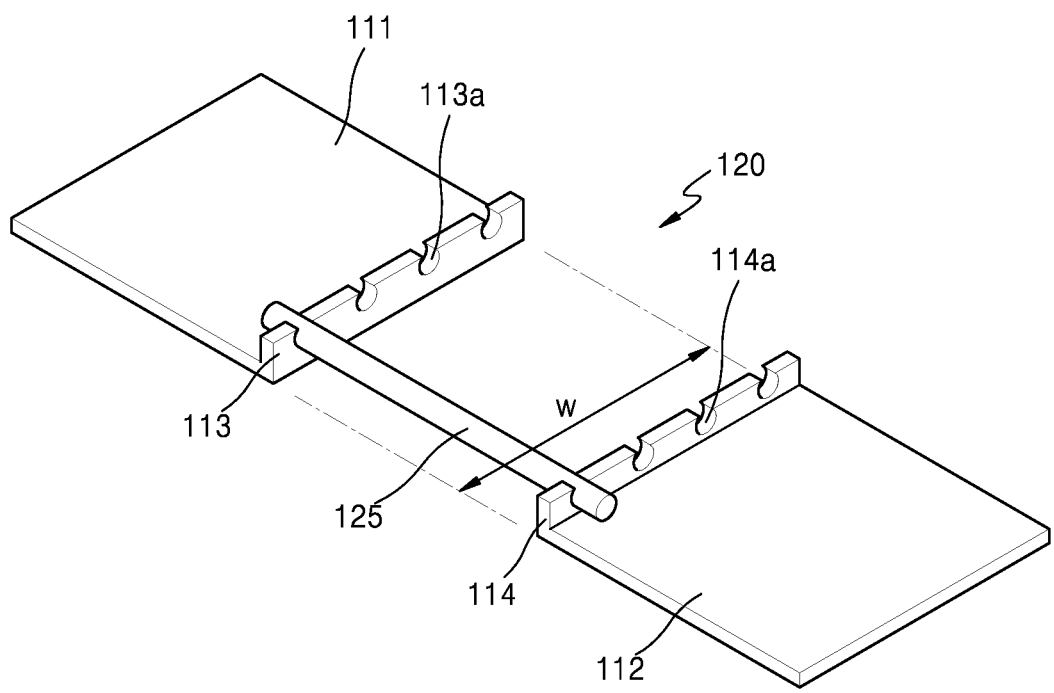
FIG. 2 illustrates a variable inductance unit of the RF surface coil of FIG. 1.

FIG. 1 illustrates a radio frequency (RF) surface coil 100 according to an embodiment, and FIG. 2 illustrates a variable inductance unit 120 of the RF surface coil 100 of FIG. 1.

Referring to FIG. 1, the RF surface coil 100 may include four conductor elements 110A, 110B, 110C, and 110D. The four conductor elements 110A, 1108, 110C, and 110D may be connected in series to each other to form a rectangular loop-shaped surface coil. A cable 190 for transmitting and/or receiving an RF signal may be connected to an end of the four conductor elements 110A, 110B, 110C, and 110D. The cable 190 may be, for example, a coaxial cable.

Each of the four conductor elements 110A, 110B, 110C, and 110D may include first and second conductive plates 111 and 112, which are spaced apart from each other, and a variable inductance unit 120, which is provided between the first and second conductive plates 111 and 112 and is used to adjust inductance of the RF surface coil 100.

Referring to FIG. 2, each of the first and second conductive plates 111 and 112 may be a plate formed of a non-magnetic conductive material. For example, the first and second conductive plates 111 and 112 may be formed of copper (Cu) or may be a copper plate coated with silver (Ag) or gold (Au). The first and second conductive plates 111 and 112 may be arranged to be spaced apart from each other on a plane. Facing end portions of the first and second conductive plates 111 and 112 may have an upward-bending structure. Four recess regions 113a and 114a may be formed in each of the facing and upward-bending end portions of the first and second conductive plates 111 and 112, thereby constituting first and second couplers 113 and 114, respectively. As an example of an attachable/detachable structure, both end portions of a conductor bar 125 may be attachably/detachably coupled to the recess regions 113a and 114a of the first and second couplers 113 and 114, and thus, the recess regions 113a and 114a may serve as coupling positions. The conductor bar 125 may be formed of a non-magnetic conductive material. For example, the conductor bar 125 may be formed of copper or may be a copper bar coated with silver or gold. The first and second couplers 113 and 114 and the conductor bar 125 may serve as the variable inductance unit 120 of the RF surface coil 100. That is, the conductor bars 125 may connect the first and second conductive plates 111 and 112 in series, and the variable inductance unit 120 in itself may have a structure allowing the conductor bars 125 to be arranged in parallel therein and to be attached to and detached from it.

Figure 3A:
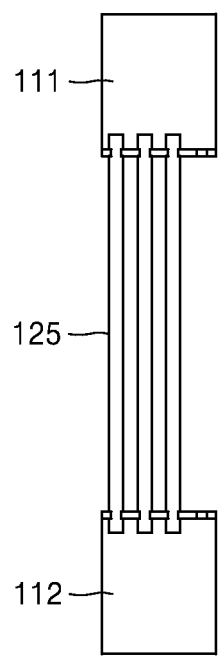
FIGS. 3A to 3E illustrate examples of ways of controlling a position of an inductor provided in the variable inductance unit of FIG. 1.
Figure 3B:
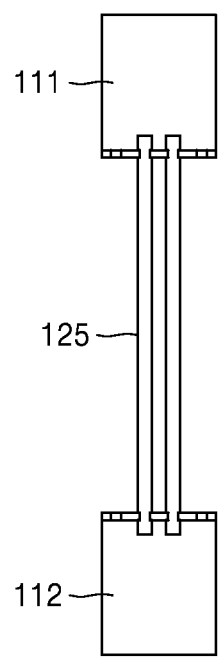
Figure 3C:
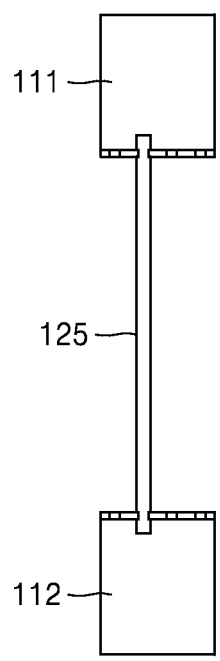

In general, inductance of a conductive plate is given as a function of its width and length. Accordingly, if widths W of the conductor elements 110A, 1108, 110C, and 110D are changed, inductances of the conductor elements 110A, 1108, 110C, and 110D are changed. In the RF surface coil 100 of the present embodiment, by changing the number of the conductor bars 125 provided in the variable inductance unit 120, it may be possible to change an effective width of the variable inductance unit 120, and thus, change the inductances of the conductor elements 110A, 1108, 110C, and 110D. For example, the number of the conductor bars 125 to be attached to the first and second conductive plates 111 and 112 can be variously changed, as shown in FIGS. 3A to 3C. In other words, one to four conductor bars 125 may be provided between the first and second conductive plates 111 and 112. Likewise, the changing of the number of the conductor bars 125 may lead to changes in the effective widths (e.g., W of FIGS. 1 and 2) of the conductor elements 110A, 1108, 110C, and 110D.

Figure 3D:
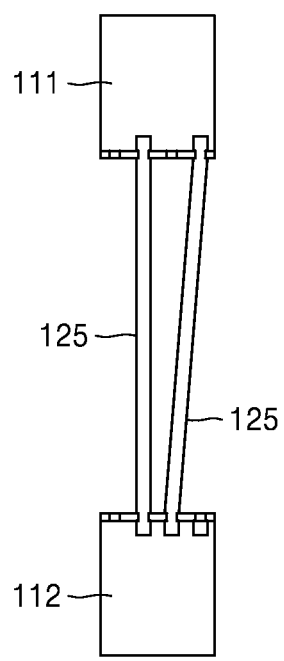
Figure 3E:
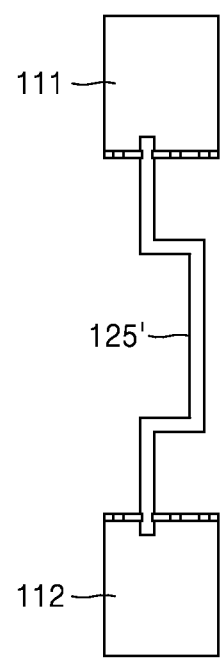

Also, an attachment position of the conductor bar 125 may be variously changed. For example, the conductor bar 125 may be arranged in a diagonal direction between the first and second conductive plates 111 and 112, as shown in FIG. 3D. Furthermore, the conductor bar 125 may have not only a straight-line shape as shown in FIGS. 3A to 3D, but also a bent shape as shown in FIG. 3E. Alternatively, the conductor bar 125 may have a curved shape or a shape with a predetermined pattern. Likewise, the shape of the conductor bar 125 may be changed to adjust the attachment position of the conductor bar 125, and this may make it possible to finely adjust the inductance of the RF surface coil 100.

Since, as described above, the attachment structure (i.e., the attachment position, the number, the shape, and so forth) of the conductor bar 125 affects the inductance value of the RF surface coil 100, the inductance of the RF surface coil 100 may be controlled by changing the attachment structure of the conductor bar 125. By virtue of the use of the attachable/detachable conductor bar 125, such control of the inductance may be easily achieved.

As will be described below, a magnetic resonance imaging (MRI) device including the RF surface coil 100 (e.g., 800 in FIGS. 11 and 12) may have a resonance frequency or a center frequency that is variously changed depending on a strength of a main magnet in use. Accordingly, by adjusting the inductance of the RF surface coil 100 using the variable inductance unit 120 of the RF surface coil 100, the RF surface coil 100 may be used for a MRI device with different resonance frequencies.

A tuning capacitor 130 may be inserted between the four conductor elements 110A, 110B, 110C, and 110D. By inserting the tuning capacitor 130 with a suitable capacitance value into the RF surface coil 100, it may be possible to adjust the capacitance of the RF surface coil 100. The tuning capacitor 130 may be a variable capacitor whose capacitance value can be changed. Alternatively, the tuning capacitor 130 may be a fixed capacitor whose capacitance value is fixed. The tuning capacitor 130, in conjunction with the variable inductance unit 120, may be used to adjust the impedance (i.e., capacitance and inductance) of the RF surface coil 100. FIG. 1 illustrates an example in which the tuning capacitor 130 is inserted between each pair of the four conductor elements 110A, 110B, 110C, and 110D, but the present invention is not limited thereto. For example, the tuning capacitor 130 may be inserted between some of the pairs of the four conductor elements 110A, 110B, 110C, and 110D.

Figure 4:
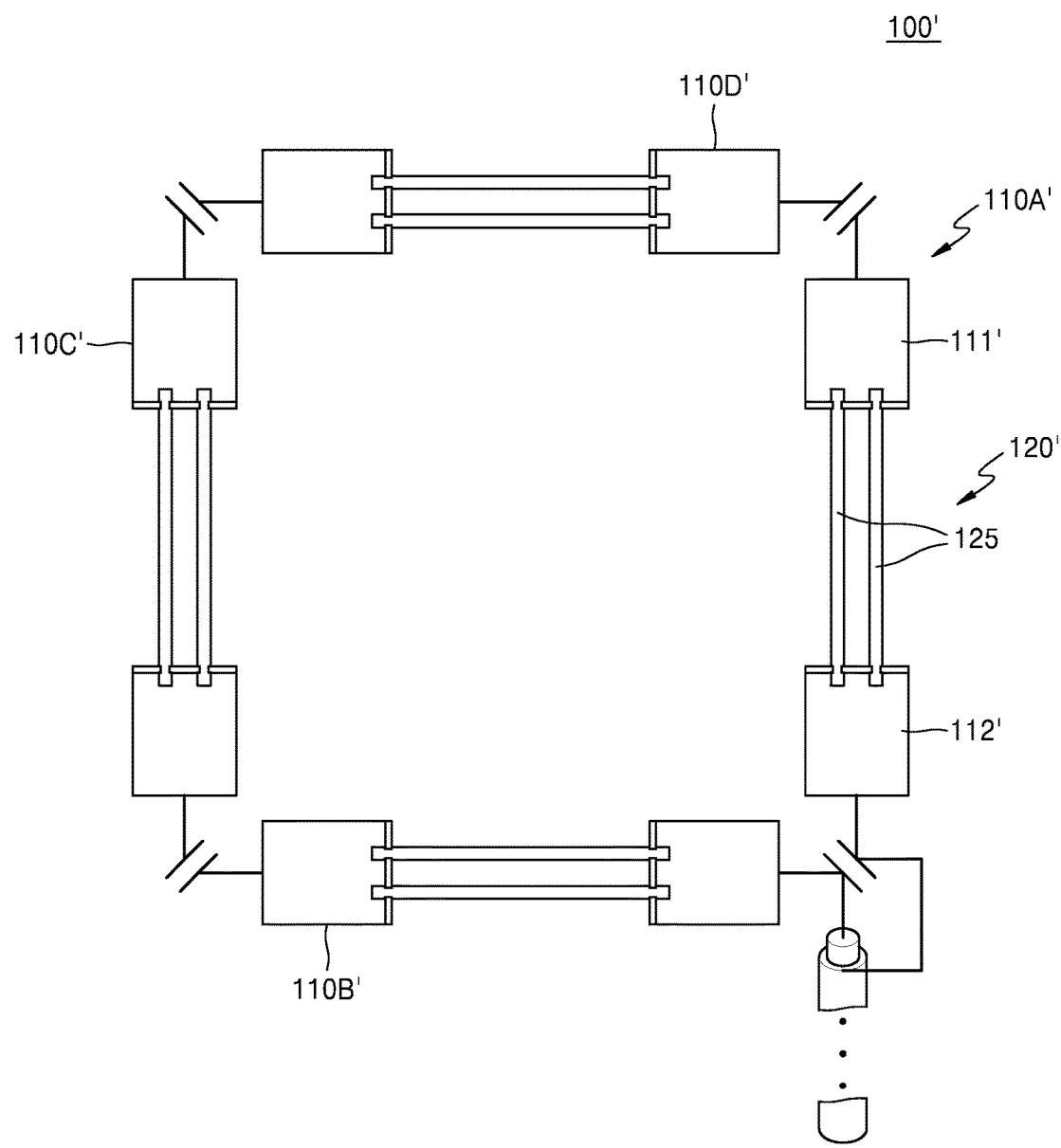
FIG. 4 illustrates another example of the variable inductance unit of the RF surface coil of FIG. 1.

FIG. 4 schematically illustrates an RF surface coil 100' according to another embodiment of the present invention. The RF surface coil 100' of the present embodiment may be substantially the same as the RF surface coil 100 of the afore-described embodiment, except for a difference in the number of the conductor bars 125 to be attached thereto, and thus, hereinafter, the different features will be described. Referring to FIG. 4, the RF surface coil 100' may include four conductor elements 110A', 110B', 110C', and 110D'. Each of the conductor elements 110A', 110B', 110C', and 110D' may include first and second conductive plates 111' and 112', which are spaced apart from each other, and a variable inductance unit 120', which is provided between the first and second conductive plates 111' and 112' and is used to adjust the inductance of the RF surface coil 100'. In the RF surface coil 100' of the present embodiment, one or two conductor bars 125 may be arranged between the first and second conductive plates 111' and 112'.

The maximum number of the conductor bars 125 to be arranged in the RF surface coil 100 or 100' of the afore-described embodiments is not limited to the illustrated examples.

Figure 5:
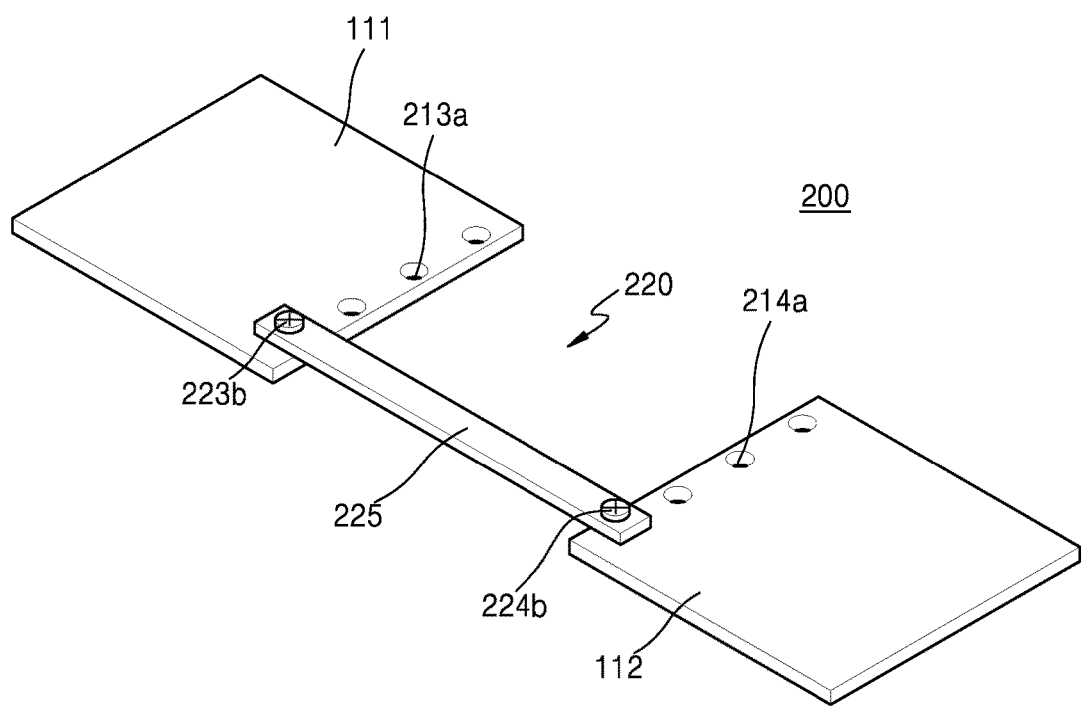
FIG. 5 schematically illustrates an RF surface coil according to another embodiment of the present invention.

FIG. 5 schematically illustrates a variable inductance unit 220 of an RF surface coil 200 according to another embodiment of the present invention. The RF surface coil 200 of the present embodiment may be substantially the same as the RF surface coils 100 and 100' of the afore-described embodiments, except for a difference in the attachable/detachable structure of the variable inductance unit 220, and thus, the different features will be mainly described below.

Referring to FIG. 5, the variable inductance unit 220 may include fastening holes 213a and 214a, which are formed in facing end portions of the first and second conductive plates 111 and 112, and a conductor bar 225, which can be attached to or detached from the fastening hole 213a or 214a. The conductor bar 225 may have both end portions, in which fastening holes (not shown) are formed, and thus, the conductor bar 225 may be connected to the fastening holes 213a and 214a of the conductive plates 111 and 112 by bolts 223b and 224b.

The conductor bar 125 or 225 may have an attachable/detachable structure that can be inserted into the first and second couplers 113 and 114 of the first and second conductive plates 111 and 112, as shown in FIG. 2, or a structure that can be attachably/detachably fastened to the first and second conductive plates 111 and 112 by the bolts 223b and 224b, as shown in FIG. 5, but the present invention is not limited to such examples. For example, the conductor bar 115 or 225 may be attachably/detachably fastened to the first and second conductive plates 111 and 112 by a clip or clamp. In addition, any known fastening device may be used for attachably/detachably fastening the conductor bar 115 or 225 to the first and second conductive plates 111 and 112.

Also, the inventive concept of the present invention is not limited to the sectional shapes of the conductor bar 125 or 225 shown in FIG. 2 or 5 and may be embodied using conductor bars with various sectional shapes.

Figure 6:
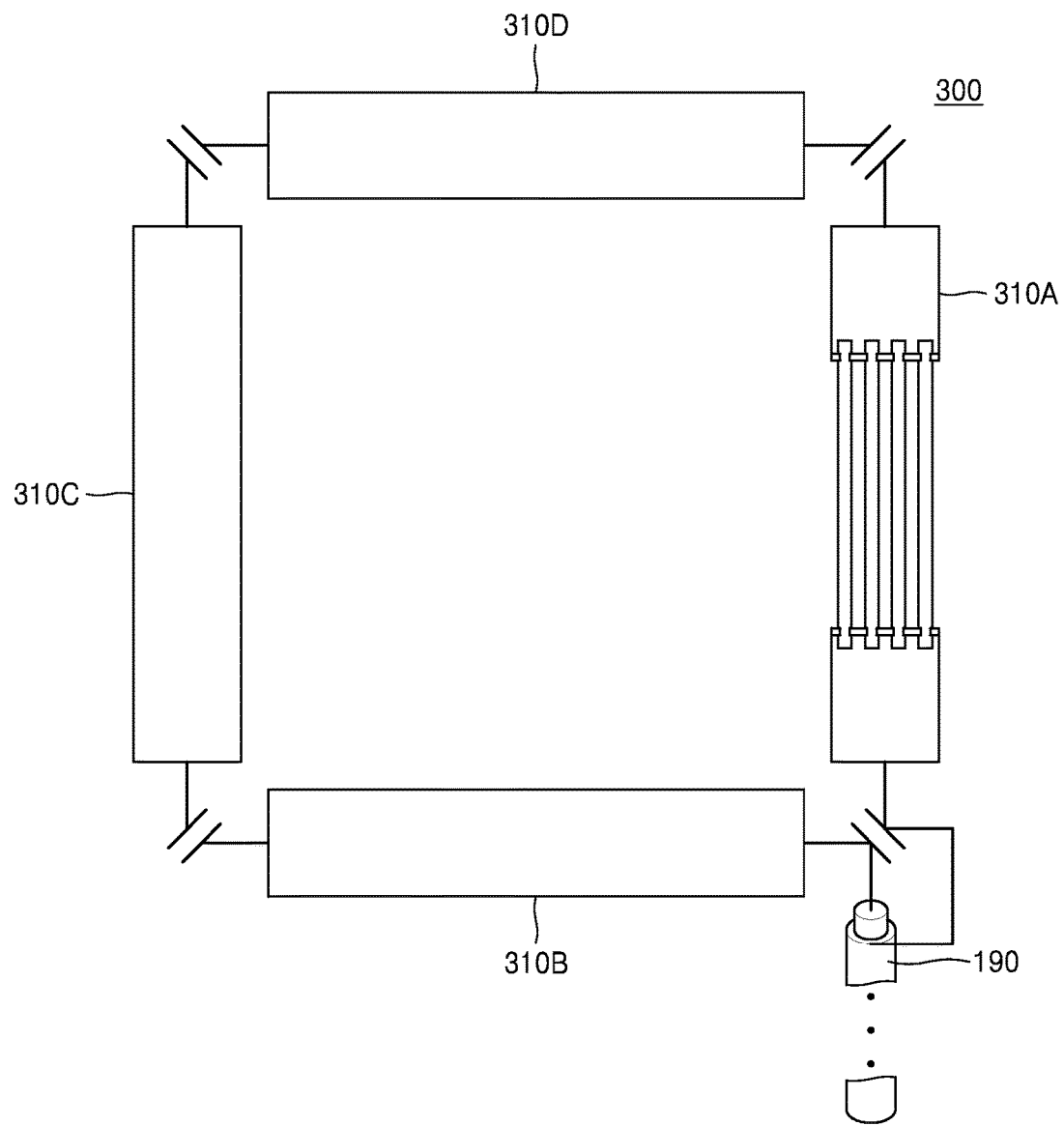
FIG. 6 schematically illustrates an RF surface coil according to another embodiment of the present invention.

FIG. 6 schematically illustrates an RF surface coil 300 according to another embodiment of the present invention. Referring to FIG. 6, the RF surface coil 300 may include first to fourth conductor elements 310A, 310B, 310C, and 310D. The first to fourth conductor elements 310A, 310B, 310C, and 310D may be connected in series to form a rectangular loop-shaped surface coil. One of the first to fourth conductor elements 310A, 310B, 310C, and 310D may have a structure with an adjustable inductance, and the others may simply be conductors with fixed inductances. For example, the first conductor elements 310A may be equipped with the variable inductance unit 120, 120', or 220 described above with reference to FIGS. 1 to 5, and the third to fourth conductor elements 310A, 310B, 310C, and 310D may be simple plate strips, as exemplarily shown in FIG. 6. However, in certain embodiments, two or three of the first to fourth conductor elements 310A, 310B, 310C, and 310D may be configured to have an adjustable inductance, and the others may be configured to have a fixed inductance.

Figure 7:
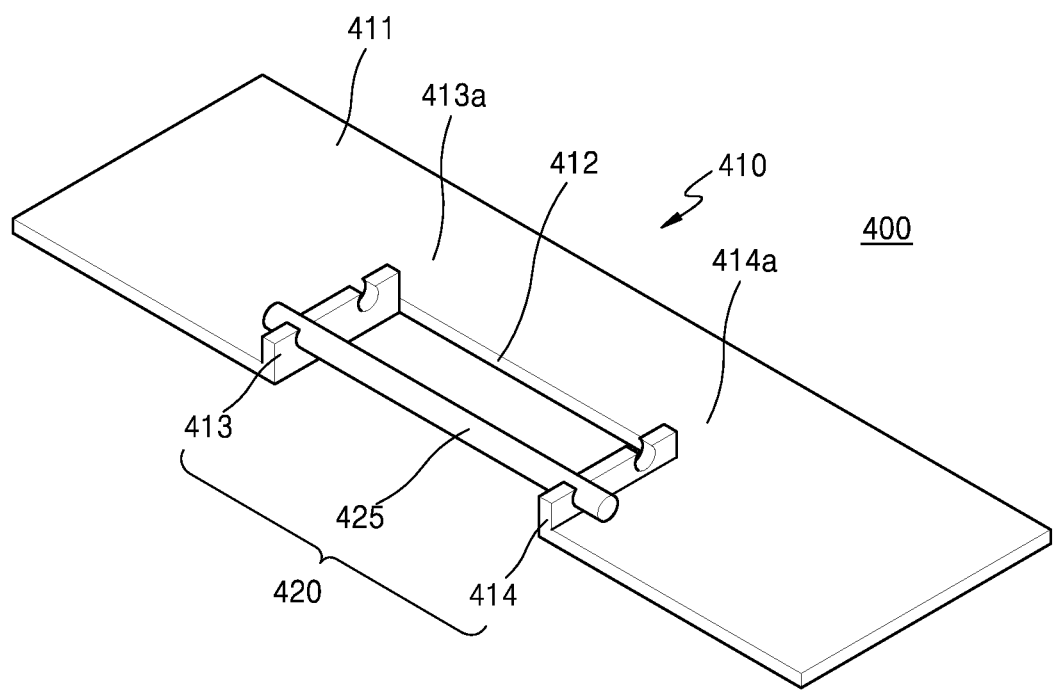
FIG. 7 schematically illustrates an RF surface coil according to another embodiment of the present invention.

FIG. 7 schematically illustrates an RF surface coil 400 according to another embodiment of the present invention. The RF surface coil 400 of the present embodiment may be substantially the same as the RF surface coils 100, 100', 200, and 300 of the afore-described embodiments, except for a structure of a variable inductance unit 420 provided in a conductor element 410 and thus, the different features will be mainly described below. Referring to FIG. 7, the conductor element 410 of the RF surface coil 400 may include a conductive plate 411. A concave region 412 with a small width may be formed in a portion (e.g., a center portion) of the conductive plate 411. The variable inductance unit 420 may be provided in the concave region 412. The concave region 412 of the conductive plate 411 may have bent edges facing each other, and in the bent edges, recess regions 413a and 414a may be formed to allow a conductor bar 425 to be positioned therein and thereby to constitute couplers 413 and 414. The variable inductance unit 420 may be configured to include the conductor bar 425 attachably/detachably connected to the couplers 413 and 414 of the conductive plate 411. In a certain sense, the conductor bar 425 may be connected in parallel to the conductive plate 411 of the conductor element 410.

The RF surface coil 400 of the present embodiment is described to have the variable inductance unit 420 that is provided in the concave region 412 of the conductive plate 411, but the present invention is not limited to this example. For example, the variable inductance unit 420 may be realized in such a way that couplers spaced apart from each other are provided at a side portion of the conductive plate 411 and allows the conductor bar 425 to be connected to the conductive plate 411 in parallel.

Figure 8:
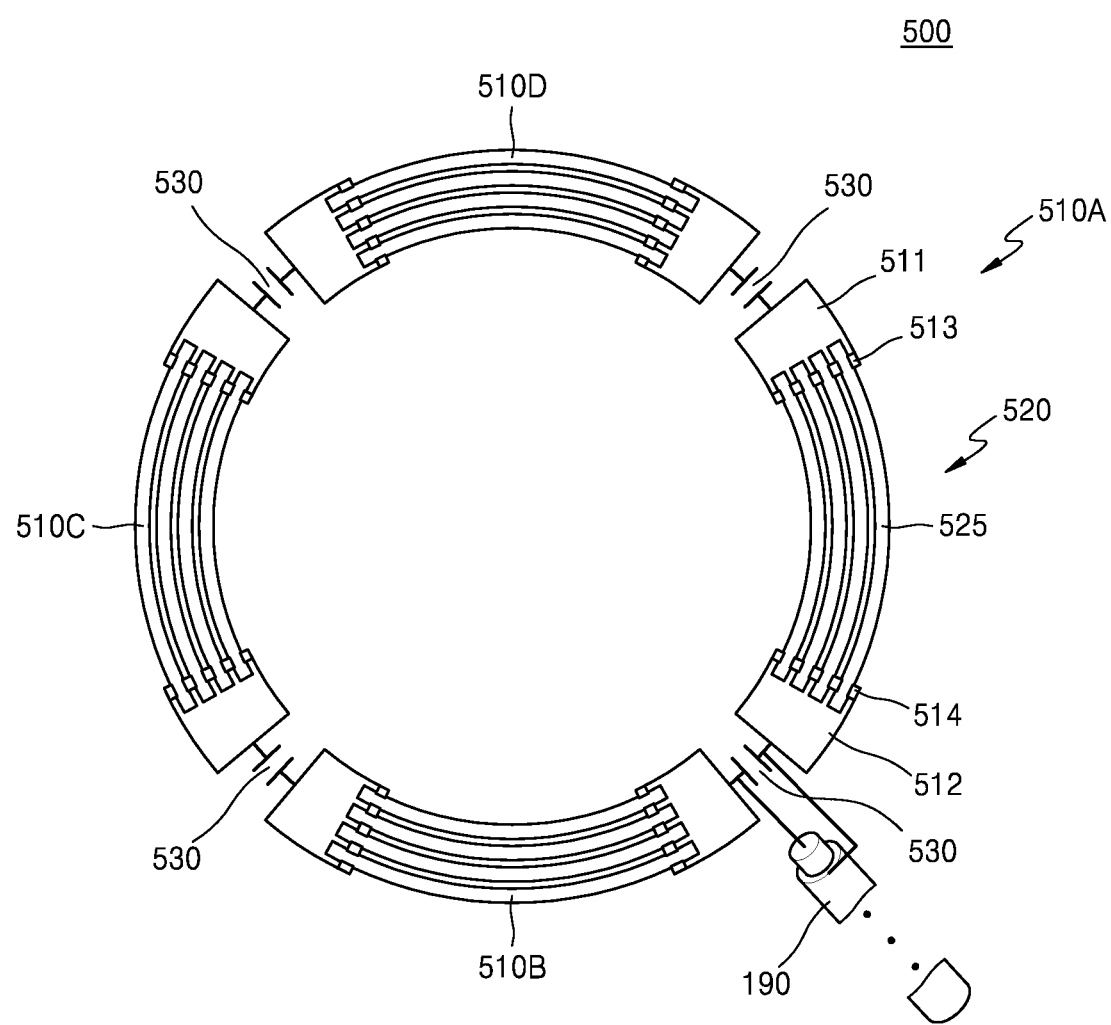
FIG. 8 schematically illustrates an RF surface coil according to another embodiment of the present invention.

FIG. 8 schematically illustrates an RF surface coil 500 according to another of the present invention. The RF surface coil 500 of the present embodiment may be substantially the same as the RF surface coils 100, 100', 200, 300, and 400 of the afore-described embodiments, except for a difference in shapes of the conductor elements 510A, 510B, 510C, and 510D, and thus, the different features will be mainly described below. Referring to FIG. 8, the RF surface coil 500 of the present embodiment may include four arc-shaped conductor elements 510A, 510B, 510C, and 510D. The conductor elements 510A, 510B, 510C, and 510D may be connected to form a circle, thereby constituting a circular loop-shaped surface coil. Since the conductor elements 510A, 510B, 510C, and 510D have arc-like shapes, first and second conductive plates 511 and 512 of each of the conductor elements 510A, 510B, 510C, and 510D may also have arc-like shapes, and moreover, a conductor bar 525 of a variable inductance unit 520, which is provided in each of the conductor elements 510A, 510B, 510C, and 510D, may also have an arc-like shape. The conductor bar 525 may be attachably/detachably connected to the first and second conductive plates 511 and 512 by first and second couplers 513 and 514, which are provided at facing end portions thereof. A tuning capacitor 530 may be positioned between conductor elements 510A, 510B, 510C, and 510D.

Figure 9:
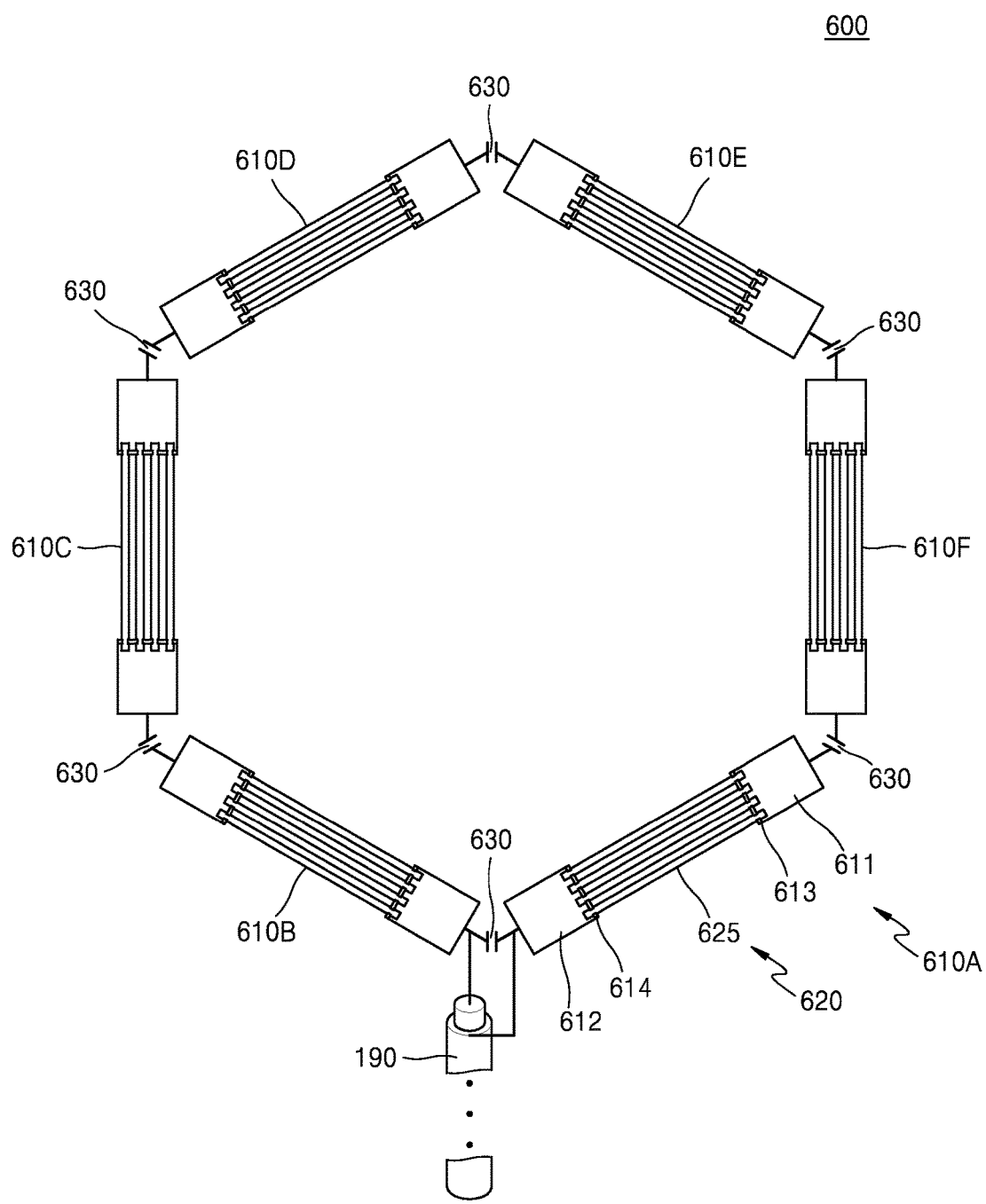
FIG. 9 schematically illustrates an RF surface coil according to another embodiment of the present invention.

FIG. 9 schematically illustrates an RF surface coil 600 according to another embodiment of the present invention. The RF surface coil 600 of the present embodiment may be substantially the same as the RF surface coils 100, 100', 200, 300, 400, and 500 of the afore-described embodiments, except for a difference in shapes of conductor elements 610, and thus the different features will be mainly described below. Referring to FIG. 9, the RF surface coil 600 of the present embodiment may include six linear conductor elements 610A, 610B, 610C, 610D, 610E, and 610F. The conductor elements 610A, 610B, 610C, 610D, 610E, and 610F may be connected in series to form a hexagonal loop-shaped surface coil. Each of the conductor elements 610A, 610B, 610C, 610D, 610E, and 610F may include first and second conductive plates 611 and 612, first and second couplers 613 and 614, and a variable inductance unit 620 including a conductor bar 625. Shapes of the first and second conductive plates 611 and 612 and the first and second couplers 613 and 614 or a structure of the variable inductance unit 620 (e.g., of the conductor bar 625) may be the same as those in the RF surface coils 100, 100', 200, 300, and 400 of the afore-described embodiments.

The RF surface coil 100, 100', 200, 300, 400, 500, or 600 described with reference to FIGS. 1 to 9 may be a single loop coil with a rectangle, circular, or hexagonal shape, but the present invention is not limited thereto and may be realized by using loop coils having various shapes.

Figure 10:
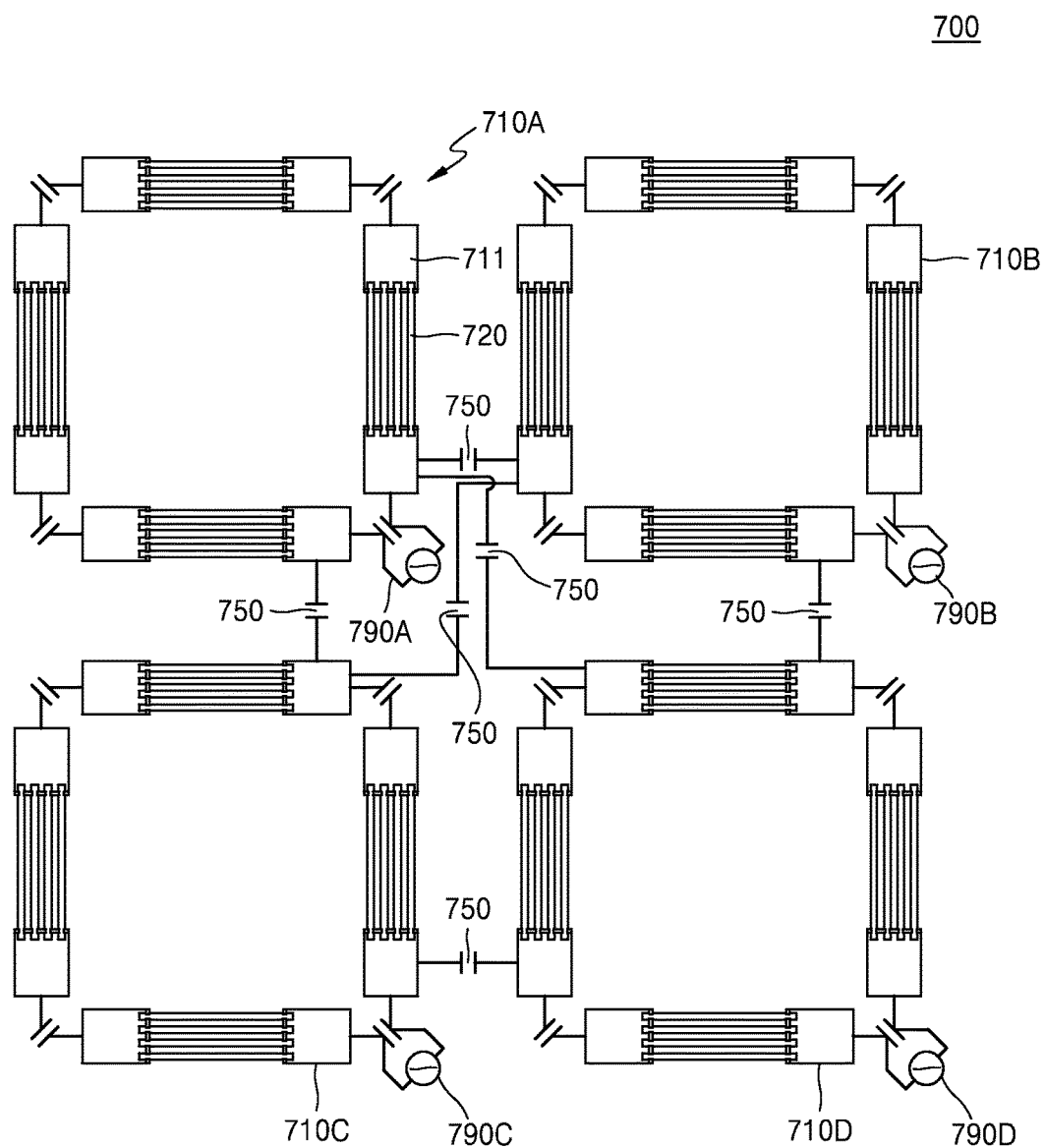
FIG. 10 schematically illustrates an RF surface coil according to another embodiment of the present invention.

FIG. 10 schematically illustrates an RF surface coil 700 according to another embodiment of the present invention. The RF surface coil 700 of the present embodiment may be a loop coil array including four loop-shaped surface coils 710A, 710B, 710C, and 710D that are arranged in two columns and two rows on a two-dimensional surface. The surface, on which the loop coil array is provided, may be a flat or curved surface. Each of the loop-shaped surface coils 710A, 710B, 710C, and 710D may be one of the loop-shaped RF surface coils 100, 100', 200, 300, 400, 500, and 600 described with reference to FIGS. 1 to 9. In other words, each of the loop-shaped surface coils 710A, 710B, 710C, and 710D may include a variable inductance unit 720 that is configured to adjust the inductance thereof. The variable inductance unit 720 may have the same structure as that of the RF surface coil 100, 100', 200, 300, or 400 of the afore-described embodiments. A decoupling capacitor 750 may be positioned between the four loop-shaped surface coils 710A, 710B, 710C, and 710D to prevent them from magnetically interacting with each other. The decoupling capacitor 750 may be an example of a decoupling device that is configured to magnetically separate adjacent ones of the loop-shaped surface coils 710A, 7108, 710C, and 710D from each other and thereby to allow for independent operations of the loop-shaped surface coils 710A, 710B, 710C, and 710D. A decoupling circuit such as inductor or transformer may be used as such a decoupling device.

The loop-shaped surface coils 710A, 710B, 710C, and 710D may be connected to an external system (e.g., an RF coil control unit 852 of FIGS. 11 and 12) via cables 790A, 790B, 790C, and 790D. Under the control of the RF coil control unit 852, the four loop-shaped surface coils 710A, 710B, 710C, and 710D may be operated in a four channel mode. For example, RF signals may be independently input to or output from the four loop-shaped surface coils 710A, 710B, 710C, and 710D. In some embodiments, the loop-shaped surface coils 710A, 710B, 710C, and 710D may be provided to constitute a parallel circuit, and intensities and phases of RF signals to be input to or output from the loop-shaped surface coils 710A, 710B, 710C, and 710D may be independently controlled. In certain cases, the loop-shaped surface coils 710A, 7108, 710C, and 710D may constitute at least two groups, each of which is configured to perform an input or output operation of RF signals in an independent manner.

The loop coil array, in which four loop-shaped surface coils 710A, 7108, 710C, and 710D are arranged in two columns and two rows, is described as an example of the RF surface coil 700 of the present embodiment, but the present invention is not limited thereto. For example, eight loop-shaped surface coils may be arranged in two columns and four rows, or sixteen loop-shaped surface coils may be arranged in four columns and four rows. In certain embodiments, a plurality of loop-shaped surface coils may be arranged in various manners and may be operated in a multi-channel mode, such as 8, 16, 32, 64, and 128 channel modes. In some embodiments, at least one or all of the loop-shaped surface coils may have the same structure as one of the single loop-shaped RF surface coils 100, 100', 200, 300, 400, 500, and 600 described with reference to FIGS. 1 to 9.

Figure 11:
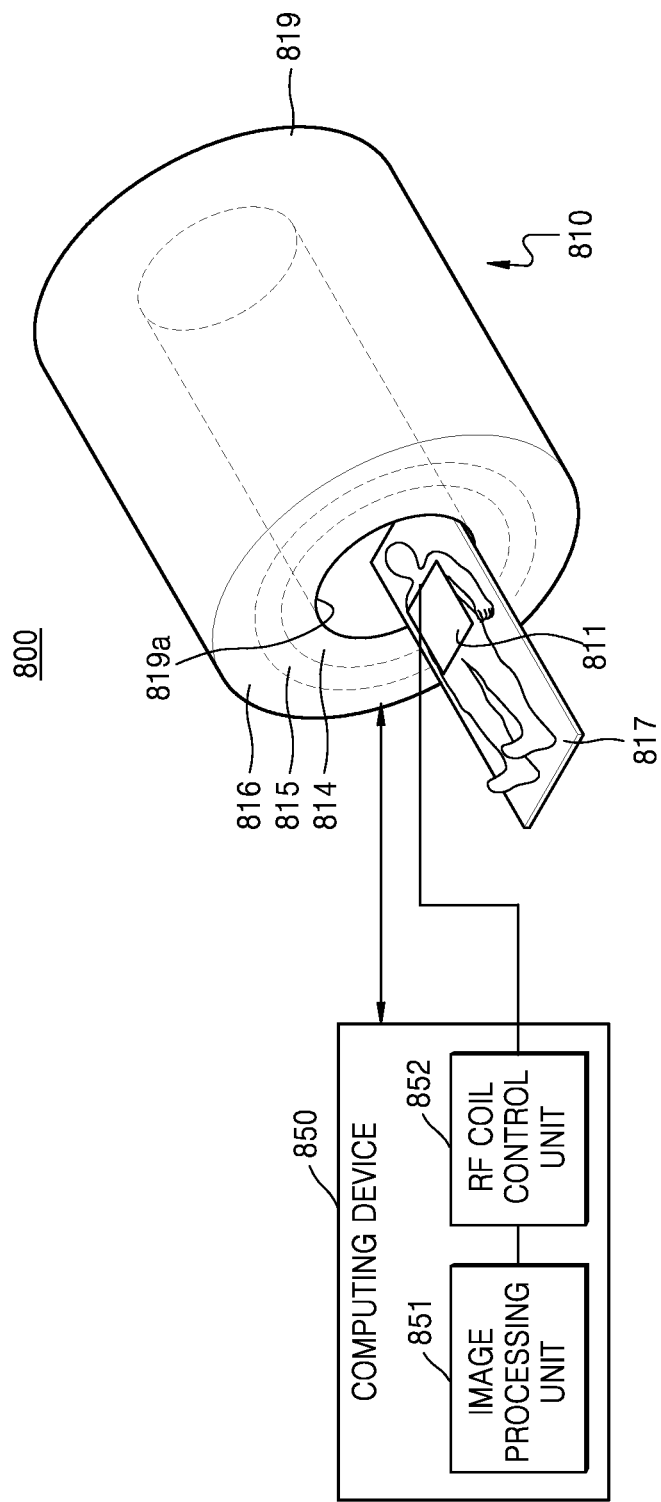
FIG. 11 illustrates a schematic configuration of a magnetic resonance imaging device according to another embodiment of the present invention.
Figure 12:
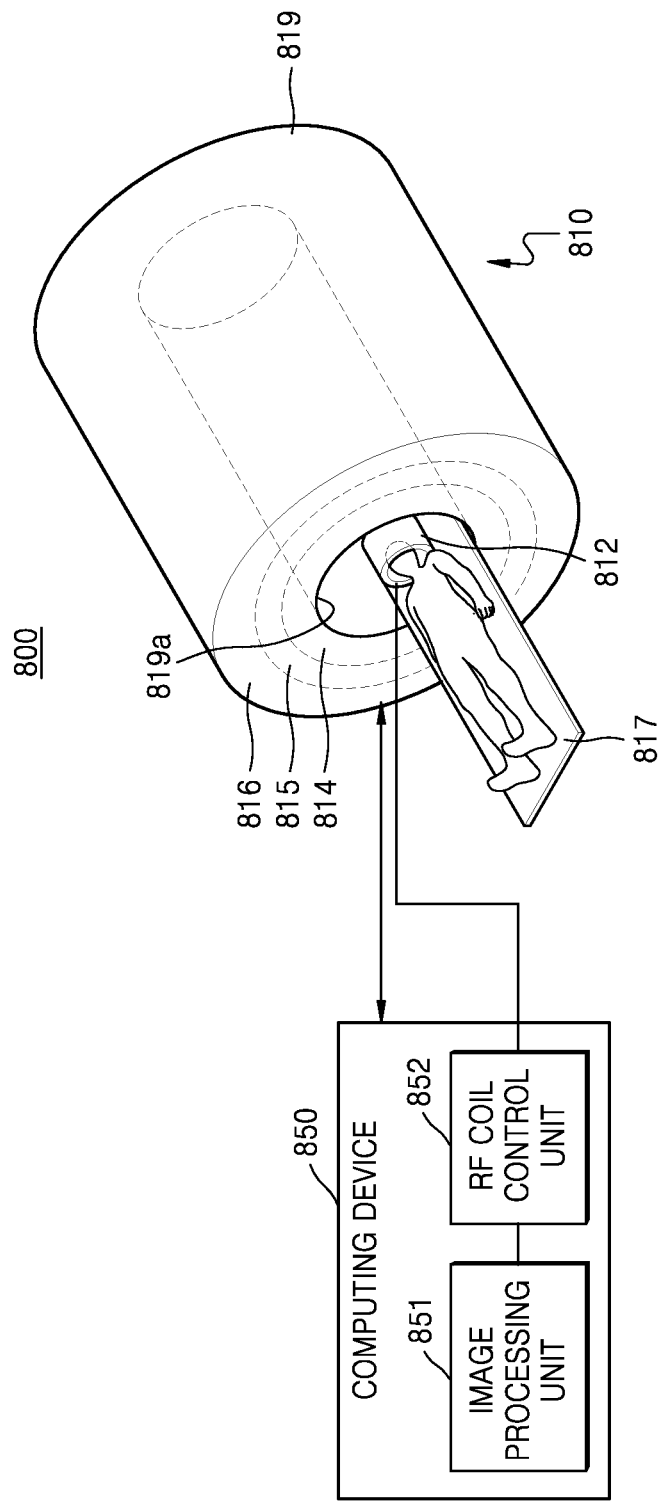
FIG. 12 illustrates a schematic configuration of a magnetic resonance imaging device according to another embodiment of the present invention.

FIGS. 11 and 12 are schematic diagrams showing example configurations of MRI devices 800 according to some embodiments of the present invention.

In the MRI devices 800 of FIGS. 11 and 12, a surface type RF coil 811 and a local volume type RF coil 812 may have plate-shaped and cylinder-shaped structures that are different from each other, but other components may be substantially the same as each other. Accordingly, hereinafter, the MRI devices 800 of FIGS. 11 and 12 will be described in conjunction with each other.

Referring to FIGS. 11 and 12, the MRI device 800 of the present embodiment may include a cylindrical magnetic structure 810 and a computing device 850.

The cylindrical magnetic structure 810 may include a body type RF coil 814, a gradient magnetic field coil 815, and a main magnet 816, which are sequentially provided in a direction from the inside to the outside. The body type RF coil 814, the gradient magnetic field coil 815, and the main magnet 816 may be mounted on a cylindrical housing 819. A subject may lie down on a table 817, and during an MRI operation, a position of the subject may be changed within a hollow region 819*a* of the cylindrical housing 819.

The body type RF coil 814, the gradient magnetic field coil 815, and the main magnet 816 may be connected to and operated and controlled by the computing device 850. The computing device 850 may also be connected to a console (not shown), on which the obtained magnetic resonance images of the subject are displayed, or to which a user's operation signal is input.

In the MRI device 800, the body type RF coil 814, in conjunction with the plate-shaped RF coil 811 of FIG. 11 or the local volume type RF coil 812 of FIG. 12 near a part of the subject under test, may be independently operated and controlled by the RF coil control unit 852 of the computing device 850.

The main magnet 816 may be configured to produce a main magnetic field for inducing a magnetic resonance phenomenon in some elements in a human body or for magnetizing hydrogen, phosphorus, sodium, and carbon nuclei. In some embodiments, the main magnet 816 may be a superconducting electromagnet or a permanent magnet.

The gradient magnetic field coil 815 may be used to produce a spatially-linear gradient magnetic field required for the MRI operation. In general, three gradient magnetic field coils, which are configured to produce gradient magnetic fields respectively in x-, y-, z-directions, may be used for the MRI operation. When a magnetization vector is rotated on a transverse plane, a rotating frequency or phase of the magnetization vector may be controlled by the gradient magnetic field coil 815, and this may make it possible to allow MRI signals to be represented in a space-frequency domain (i.e., a k-region).

To create the MRI signals, it may be necessary to align the magnetization vector to the transverse plane, and to attain this end, at least one of the body type RF coil 814, the surface type RF coil 811, and the local volume type RF coil 812 may be configured to produce an RF magnetic field whose center frequency is the Larmor frequency. If the body type RF coil 814, the surface type RF coil 811, or the local volume type RF coil 812 is applied with an RF current with the Larmor frequency, it may produce a magnetic field rotating at the Larmor frequency. The rotating magnetic field may induce the resonance of the magnetization vector (i.e., the nuclear magnetic resonance), and thus, the magnetization vector may be aligned to the transverse plane. If the magnetization vector is aligned once to the transverse plane, the magnetization vector rotating at the Larmor frequency on the transverse plane may generate an electromotive force in the body type RF coil 814, the surface type RF coil 811, or the local volume type RF coil 812, as described by Faraday's law. Electromotive force signals (i.e., RF signals to be received from the electromotive force) may be amplified by an RF amplifier and may then be demodulated into a sine wave of the Larmor frequency, and this operation may be used to obtain magnetic resonance signals of a baseband. The magnetic resonance signals of the baseband may be transmitted to the computing device 850 and may be used to create magnetic resonance images through a processing operation (e.g., quantization) by an image processing unit 851.

A general process of creating the magnetic resonance images in the MRI device 800 has been briefly described above. The process of creating magnetic resonance images is well known to a skilled person in the art, and thus, a detailed description thereof will be omitted.

In the MRI device 800, the body type RF coil 814 provided in the cylindrical housing 819 may be used to obtain a magnetic resonance image of the whole body of a subject. By contrast, a surface type or cylindrical local volume type RF coil 811 or 812 provided near the part of the body of the subject may be used to obtain a magnetic resonance image of a part (e.g., head, chest, leg, and so forth) of the body of the subject. The surface type or local volume type RF coil 811 or 812 may be an independent device that is separately provided outside the cylindrical housing 819. Also, the surface type or local volume type RF coil 811 or 812 may be a portable device that can be moved on a specific part of a body of a subject, on which an MRI operation will be performed. At least one of the RF surface coils 100, 100', 200, 300, 400, 500, 600, and 700 described with reference to FIGS. 1 to 10 may be used for the surface type and local volume type RF coils 811 and 812. For example, in the case of the surface type RF coil 811, at least one of the RF surface coils 100, 100', 200, 300, 400, 500, 600, and 700 of the afore-described embodiments may be mounted on a plate-shaped plastic mold with a hard or soft property. As another example, in the case of the local volume type RF coil 812, at least one of the RF surface coils 100, 100', 200, 300, 400, 500, 600, and 700 of the afore-described embodiments may be mounted in an enclosing manner on a cylindrical plastic mold.

The MRI device 800 may be operated with various resonance frequencies. For example, the MRI device 800 may have operation frequencies of 127.74 MHz, 200 MHz, 300 MHz, and 400 MHz, when it is operated at conditions of 3 Tesla (T), 4.7 T, 7 T, and 9.4 T, respectively.

Since inductance of a conventional RF surface coil is determined by a structure (e.g., a size, a shape, a thickness, and so forth) of a copper wire or a copper plate thereof, the conventional RF surface coil has a fixed inductance. Accordingly, thus, in order to use a single RF surface coil for an MRI device with different center frequencies, it may be necessary to change capacitance of a tuning capacitor inserted in the RF surface coil. However, in the case where only the capacitance of the capacitor has to be changed, due to no degree of freedom in selecting the capacitance value, it may be not easy to suppress a frequency shift which may be caused by a subject loading effect.

By contrast, in the present embodiments, the RF surface coils 100, 100', 200, 300, 400, 500, 600, and 700 of the afore-described embodiments may be used as the RF surface coil 811 or 812, and thus, the inductance of the RF surface coil 811 or 812 can be variably adjusted. This may make it possible to use a single RF surface coil for an MRI device with different center frequencies. Also, in the case where a variable capacitor is used as a tuning capacitor of the RF surface coil 811 or 812, it may be possible to adjust both of inductance and capacitance of the RF surface coil 811 or 812. In particular, the use of a relatively high capacitance value may make it possible to minimize the frequency shift, which may be caused by a subject loading effect.

In the afore-described embodiments, MRI devices have been described as examples of the present invention, but the present invention is not limited thereto. For example, given that an RF coil, which is substantially the same as that of the MRI device, is used in an MRS device, a skilled person in this art would find it obvious that the RF surface coils according to the afore-described embodiments of the present invention can be applied for the MRS device.

The MRS device may be used to analyze physical, chemical, biological properties of a material using the magnetic resonance phenomenon. In the MRS device, a transmission RF coil may be used to provide a pulsed RF signal exciting some kinds of atoms to a subject within a strong magnetic field, and thereby to induce a magnetic resonance phenomenon, and a reception RF coil may be positioned near the subject and may be used to detect a magnetic resonance signal and to classify a magnetic resonance signal by frequency. Since a difference in kinds of atoms in the subject leads to a difference in magnetic resonance frequency, by examining a spectrum of the magnetic resonance signal, it may be possible to determine the kinds of atoms contained in the subject. Even in the MRS device, a transmission RF coil for transmitting a pulsed RF signal may be configured to have substantially the same structure and function as those of the afore-described RF coil for the MRI device. That is, the RF surface coils in the afore-described embodiments may be used as the transmission RF coil of the MRS device.

While the afore-described plate-shaped RF coil and the magnetic resonance device employing the same have been particularly shown and described with reference to some embodiments illustrated in the drawings, it will be understood that various changes in form and details may be made therein without departing from the spirit and scope of the following claims.

The invention claimed is:

1. A radio frequency (RF) surface coil for a magnetic resonance device, the RF surface coil comprising:
 a plurality of conductor elements connected in series to form a loop-shaped surface coil; and
 a variable inductance unit provided in at least one of the plurality of conductor elements to adjust inductance,
 wherein the variable inductance unit comprises a conductor bar and a coupler for attachably/detachably coupling end portions of the conductor bar to at least one of the plurality of conductor elements.

2. The RF surface coil of claim 1, wherein the coupler comprises a plurality of coupling positions, to which the conductor bar is attachably/detachably coupled.

3. The RF surface coil of claim 2, wherein the conductor bar is positioned parallel to, or diagonally coupled to, the plurality of coupling positions.

4. The RF surface coil of claim 1, wherein the conductor bar has a linear shape, a bent shape, or a curved shape.

5. The RF surface coil of claim 1, wherein the conductor bar is connected in series to at least one of the plurality of conductor elements.

6. The RF surface coil of claim 5, wherein the at least one of the plurality of conductor elements comprises conductive plates spaced apart from each other,
 the coupler comprises first and second couplers provided at facing end portions of the conductive plates, and
 the conductor bar is connected in series to the conductive plates by being attachably/detachably coupled to the first and second couplers.

7. The RF surface coil of claim 1, wherein the conductor bar is connected in parallel to at least one of the plurality of conductor elements.

8. The RF surface coil of claim 7, wherein the at least one of the plurality of conductor elements comprises a conductive plate,
 the coupler comprises first and second couplers provided at a side portion of the conductive plate, and
 the conductor bar is connected in parallel to the conductive plate by being attachably/detachably coupled to the first and second couplers.

9. The RF surface coil of claim 1, wherein the coupler is a recess region, which allows the conductor bar to be attachably/detachably coupled thereto, or a fastening hole, which allows the conductor bar to be fastened thereto by a bolt.

10. The RF surface coil of claim 1, further comprising at least one tuning capacitor positioned between at least some of the plurality of conductor elements to adjust capacitance.

11. The RF surface coil of claim 10, wherein the tuning capacitor is a variable capacitor with a variable capacitance.

12. The RF surface coil of claim 1, wherein the loop-shaped surface coil formed by the plurality of conductor elements is one of rectangular, circular, and hexagonal loop-shaped surface coils.

13. The RF surface coil of claim 1, comprising a loop coil array in which a plurality of loop-shaped surface coils are arranged,
   wherein at least some of the plurality of loop-shaped surface coils comprise the variable inductance unit.

14. The RF surface coil of claim 13, further comprising a decoupling device positioned between the plurality of loop-shaped surface coils to prevent the plurality of loop-shaped surface coils from magnetically interacting with each other.

15. The RF surface coil of claim 13, wherein the plurality of loop-shaped surface coils are independently operated.

16. A magnetic resonance device, comprising:
   a main magnet; and
   a radio frequency (RF) surface coil comprising
      a plurality of conductor elements connected in series to form a loop-shaped surface coil, and
      a variable inductance unit provided in at least one of the plurality of conductor elements to adjust inductance,
   wherein the variable inductance unit comprises a conductor bar and a coupler for attachably/detachably coupling end portions of the conductor bar to at least one of the plurality of conductor elements.

17. The magnetic resonance device of claim 16, wherein the RF surface coil is a transmission coil for transmitting an RF signal, a reception coil for receiving a magnetic resonance signal induced in a subject, or a transceiving coil for transmitting an RF signal and receiving a magnetic resonance signal induced in a subject.

18. The magnetic resonance device of claim 16, wherein the magnetic resonance device is a magnetic resonance imaging device, and
   the RF surface coil is a surface type RF coil or a local volume type RF coil provided near the subject.

19. The magnetic resonance device of claim 18, further comprising,
   a body type RF coil;
   a gradient magnetic field coil; and
   a cylindrical housing, in which the main magnet, the body type RF coil, and the gradient magnetic field coil are mounted.

20. The magnetic resonance device of claim 16, wherein the coupler comprises a plurality of coupling positions, to which the conductor bar is attachably/detachably coupled.

* * * * *